(12) United States Patent
Kang

(10) Patent No.: US 9,419,221 B2
(45) Date of Patent: Aug. 16, 2016

(54) METHOD OF FABRICATING SEMICONDUCTOR INTEGRATED CIRCUIT HAVING PHASE-CHANGE LAYER

(71) Applicant: SK hynix Inc., Gyeonggi-do (KR)

(72) Inventor: Se Hun Kang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 191 days.

(21) Appl. No.: 14/303,333

(22) Filed: Jun. 12, 2014

(65) Prior Publication Data
US 2015/0263283 A1    Sep. 17, 2015

(30) Foreign Application Priority Data

Mar. 17, 2014  (KR) .......................... 10-2014-0031038

(51) Int. Cl.
*H01L 45/00* (2006.01)
*H01L 27/24* (2006.01)

(52) U.S. Cl.
CPC ........ *H01L 45/1616* (2013.01); *H01L 27/2463* (2013.01); *H01L 45/06* (2013.01); *H01L 45/065* (2013.01); *H01L 45/124* (2013.01); *H01L 45/1683* (2013.01)

(58) Field of Classification Search
CPC ..... H01L 45/06; H01L 45/065; H01L 45/144; H01L 45/1233; H01L 45/126; H01L 45/1683; H01L 45/124; H01L 45/1616; H01L 27/2436
See application file for complete search history.

(56) References Cited

U.S. PATENT DOCUMENTS

| 4,641,420 | A  | * | 2/1987 | Lee .................... | H01L 21/76801 148/DIG. 19 |
| 7,704,787 | B2 | * | 4/2010 | Hideki ............... | G11C 13/0004 257/E21.068 |
| 7,868,313 | B2 | * | 1/2011 | Breitwisch .......... | H01L 45/06 257/2 |
| 2008/0054244 | A1 | * | 3/2008 | Lee ..................... | H01L 27/2409 257/3 |
| 2008/0210924 | A1 | * | 9/2008 | Shin ................... | H01L 27/2436 257/4 |
| 2012/0142141 | A1 | * | 6/2012 | Park ................... | H01L 45/04 438/102 |

FOREIGN PATENT DOCUMENTS

KR    1020130011550    1/2013

* cited by examiner

*Primary Examiner* — Michael Trinh
(74) *Attorney, Agent, or Firm* — IP & T Group LLP

(57) ABSTRACT

A method of fabricating a semiconductor integrated circuit that includes forming a lower electrode in a semiconductor substrate, forming an interlayer insulating layer including a phase-change region exposing the lower electrode on the semiconductor substrate, forming a first phase-change layer having a crystalline state along surfaces of the interlayer insulating layer and an exposed lower electrode, and growing a second phase-change layer on the first phase-change layer based on the crystallinity of the first phase-change layer to be filled in the phase-change region.

5 Claims, 4 Drawing Sheets

METHOD OF FABRICATING SEMICONDUCTOR INTEGRATED CIRCUIT HAVING PHASE-CHANGE LAYER

CROSS-REFERENCES TO RELATED APPLICATION

This application claims priority under 35 U.S.C. 119(a) to Korean application No. 10-2014-0031038, filed on Mar. 17, 2014, in the Korean intellectual property Office, which is incorporated by reference in its entirety as set forth in full.

BACKGROUND

1. Technical Field

Various embodiments of the inventive concept relate to a method of fabricating a semiconductor integrated circuit, and more particularly, to a method of fabricating a phase-change random access memory (PCRAM) device including a phase-change layer.

2. Related Art

With the rapid development of mobile and digital information communication and the consumer-electronics industry, studies on existing charge-controlled devices have encountered limitations. Thus, new functional memory devices with novel concepts other than existing charge-controlled memory devices need to be developed. In particular, next-generation memory devices with large capacities, ultra-high speed, and ultra-low power need to be developed to satisfy the demand for large capacity memories.

Variable resistive memory devices using a resistance material as a memory medium have been suggested as the next-generation memory devices, and typical examples of variable resistive memory devices are PCRAMs, resistive RAMs (ReRAMs), or magnetoresistive RAMs (MRAMs).

A variable resistive memory device may be typically formed of a switching device and a resistance device, and may store data "0" or "1" depending on the state of the resistance device.

The goal of variable resistive memory devices is to improve integration density and to integrate as many memory cells as possible in a limited area.

Variable resistive layers in resistance devices, phase-change layers for example, are formed in various structures. Defining a phase-change region in an interlayer insulating layer and burying the phase-change material layer in the phase-change region has been the main method used.

With increasing integration density in variable resistive memory devices, the diameter (or a line width) of the phase-change region is constantly being reduced. Thus, there is a need for a method of burying a phase-change material in a narrow phase-change region without a void.

SUMMARY

According to an exemplary embodiment of the present invention, a method of fabricating a semiconductor integrated circuit is provided. The method may include forming a first phase-change layer having a crystalline state, and growing a second phase-change layer on the first phase-change layer based on the crystallinity of the first phase-change layer.

According to an exemplary embodiment of the present invention, a method of fabricating a semiconductor integrated circuit is provided. The method may include forming a lower electrode in a semiconductor substrate, forming an interlayer insulating layer including a phase-change region exposing the lower electrode on the semiconductor substrate, forming a first phase-change layer having a crystalline state along surfaces of the interlayer insulating layer and an exposed lower electrode, and growing a second phase-change layer on the first phase-change layer based on the crystallinity of the first phase-change layer to be filled in the phase-change region.

According to an exemplary embodiment of the present invention, a method of fabricating a semiconductor integrated circuit is provided. The method may include forming a lower electrode in a semiconductor substrate, forming an interlayer insulating layer including a phase-change region exposing the lower electrode on the semiconductor substrate, forming a first phase-change layer having a crystalline state along surfaces of the interlayer insulating layer and an exposed lower electrode, growing a second phase-change layer on the first phase-change layer based on crystallinity of the first phase-change layer to be filled in the phase-change region under amorphous deposition conditions, forming a resistive layer by planarizing the second phase-change layer and the first phase-change layer in the phase-change region, and forming an upper electrode on the resistive layer.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
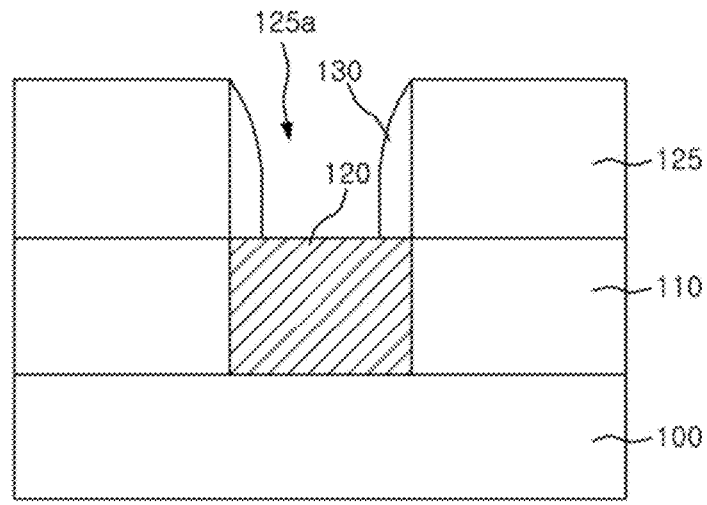
FIGS. 1 to 4 are cross-sectional views illustrating a method of fabricating a semiconductor integrated circuit according to an embodiment of the inventive concept.

Exemplary embodiments will be described in greater detail with reference to the accompanying drawings. Variations in the shapes of the illustrations as a result of manufacturing techniques and/or tolerances, for example, are to be expected. Thus, exemplary embodiments should not be construed as limited to the particular shapes and regions illustrated. Lengths, widths, and heights of layers and regions may be exaggerated for clarity. Like reference numerals in the drawings denote like elements. It is also understood that when a layer is referred to as being "on" another layer or substrate, it can be directly on the other or substrate, or intervening layers may also be present. Also, in this specification, "connected/coupled" refers to one component not only directly coupling another component but also indirectly coupling another component through an intermediate component. In addition, a singular form may include a plural form, and vice versa, as long as it is not specifically mentioned.

The inventive concept is described herein with reference to illustrations of embodiments of the inventive concept. However, embodiments of the inventive concept should not be construed as limiting the inventive concept. Although a few embodiments of the inventive concept will be described, it will be appreciated by those of ordinary skill in the art that changes may be made in these exemplary embodiments without departing from the principles and spirit of the inventive concept.

FIGS. 1 to 4 are cross-sectional views illustrating a method of fabricating a semiconductor integrated circuit according to an embodiment of the inventive concept.

Referring to FIG. 1, a base insulating layer 110 may be formed on a semiconductor substrate 100. Although not shown in FIG. 1, a switching device which selectively provides current to a phase-change layer to be formed later may be further formed between the semiconductor substrate 100 and the base insulating layer 110. A predetermined portion of the base insulating layer 110 is etched to form a contact hole (not shown), and a conductive material is filled within the contact hole to form a lower electrode 120. The lower electrode 120 may be electrically coupled to the switching device (not shown).

An interlayer insulating layer 125 is deposited on the base insulating layer 110 in which the lower electrode 120 is formed. The interlayer insulating layer 125 is etched to expose a surface of the lower electrode 120, and thus a through hole 125a corresponding to a phase-change region is formed.

Next, a spacer 130 is formed on an edge of the through hole 125a through a general method. The spacer 130 may include, for example, a silicon nitride layer having good high-resistance. The phase-change region may be formed to have a diameter (or a line width) which is increased toward a top thereof by the spacer 130.

Figure 2:
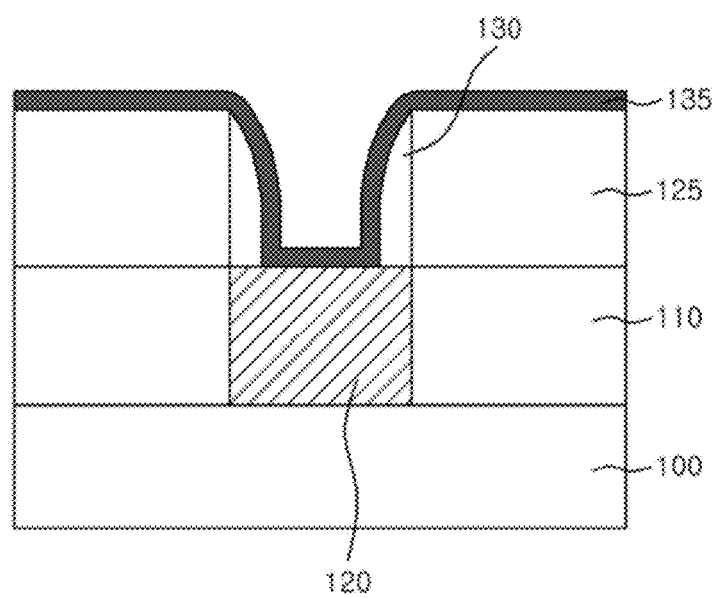

Referring to FIG. 2, a first phase-change layer 135 is formed along a surface of the semiconductor substrate in which the phase-change region is defined, that is, surfaces of the lower electrode 120, the spacer 130, and the interlayer insulating layer 125. The first phase-change layer 135 may be deposited to have a crystalline state/structure. For example, temperature and deposition conditions may be changed in order to form the first phase-change layer 135 in the crystalline state/structure (crystals). In an embodiment, the first phase-change layer 135 may be deposited through a chemical vapor deposition (CVD) method or an atomic layer deposition (ALD) method, in a temperature range that gives the crystalline state/structure to the first phase-change layer 135.

Figure 3:
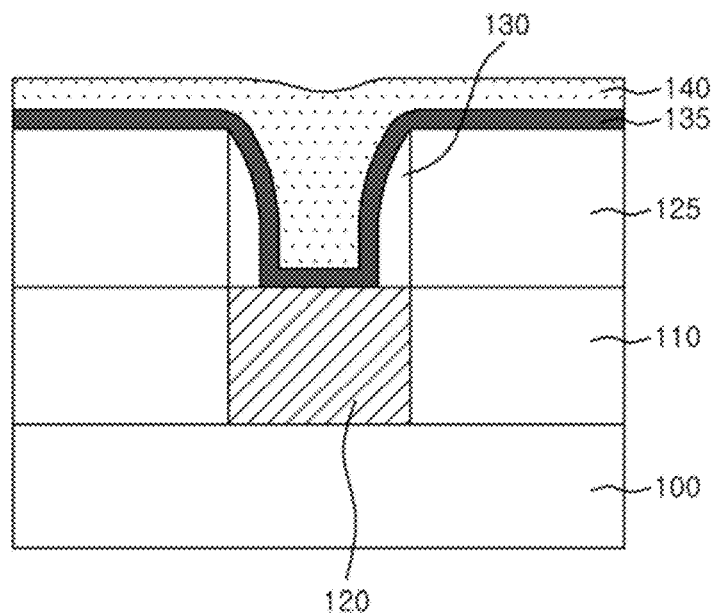

Referring to FIG. 3, a second phase-change layer 140 is formed on the first phase-change layer 135. The second phase-change layer 140 may be formed with a thickness sufficient to fill the phase-change region. That is, the second phase-change layer 140 may be formed with a thickness greater than the first phase-change layer 135. For effective gap-fill, the second phase-change layer 140 may be formed under the condition that provides an amorphous state/structure to the second phase-change layer, for example, in a temperature range of 200 to 400° C. through an ALD method.

The second phase-change layer 140 is formed under amorphous deposition conditions to obtain good gap-fill properties as described above. However, since the second phase-change layer 140 is grown based on the crystallinity of the first phase-change layer 135 having a crystalline state/structure below the second phase-change layer 140, the second phase-change layer 140 may be grown to have partial crystalline characteristics (state/structure), and thus the second phase-change layer 140 is densely buried in the phase-change region without a void. The second phase-change layer 140 may be grown along the crystals of the first phase-change layer 135. As is well known, gap-fill properties of an amorphous layer are superior to that of a crystal layer. Since the second phase-change layer 140 is formed in an amorphous state and based on the crystallinity of the first phase-change layer 135, the second phase-change layer 135 has good gap-filling properties.

The first and second phase-change layers 135 and 140 may include a phase-change chalcogenide alloy such as germanium-antimony-tellurium (GST) (for example, a Ge—Sb—Te material such as $Ge_2Sb_2Te_5$, $Ge_2Sb_2Te_7$, $Ge_1Sb_2Te_4$, or $Ge_1Sb_4Te_7$). A chemical composition notation represented by a hyphen (-) used herein represents elements contained in a specific mixture or compound, and serves to represent all chemical structures containing the represented elements. In addition to the Ge—Sb—Te material, the first and second phase-change layers 135 and 140 may include Ge—Te, In—Se, Sb—Te, Ga—Sb, In—Sb, As—Te, Al—Te, Ge—Sb—Te (or Sn—Sb—Se or Ge—Sb—Se), Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt.

Figure 4:
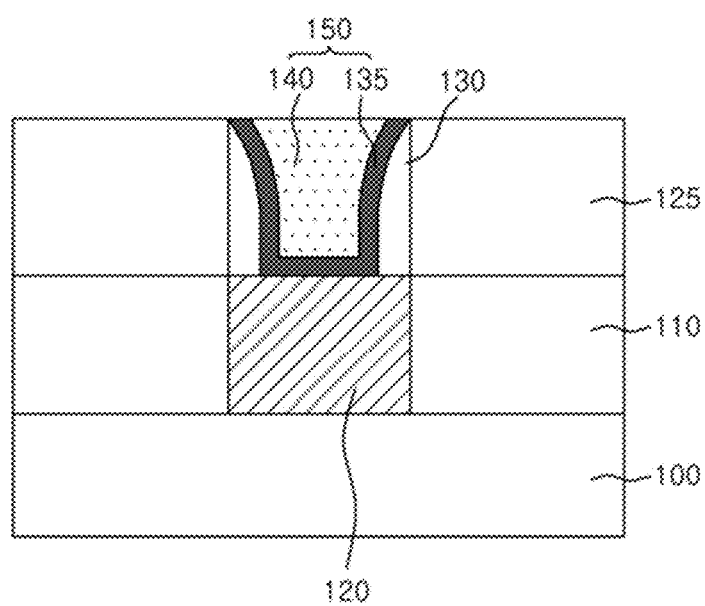

Referring to FIG. 4, the second and first phase-change layers 2) 140 and 135 are planarized to expose a surface of the interlayer insulating layer 125, and thus a resistive layer 150 is formed. Subsequently, although not shown in FIG. 4, an upper electrode (not shown) may be formed on the resistive layer 150.

After the process of forming the second phase-change layer 140 or the process of forming the resistive layer 150, a heat-treatment process may be further performed to provide a crystalline characteristic to the second phase-change layer 140. Since the second phase-change layer 140 has a certain degree of crystallinity as described above, the second phase-change layer 140 may have sufficient crystalline characteristics even when the heat-treatment process is performed at a lower temperature than the general crystallization process. The second phase-change layer 140 may be reflowed through the above-described heat-treatment process, and thus a void which may be additionally caused may be completely removed.

A method of fabricating a semiconductor integrated circuit having a horizontal channel switching device according to an embodiment of the present invention will now be described with reference to FIGS. 5 to 7.

Figure 5:
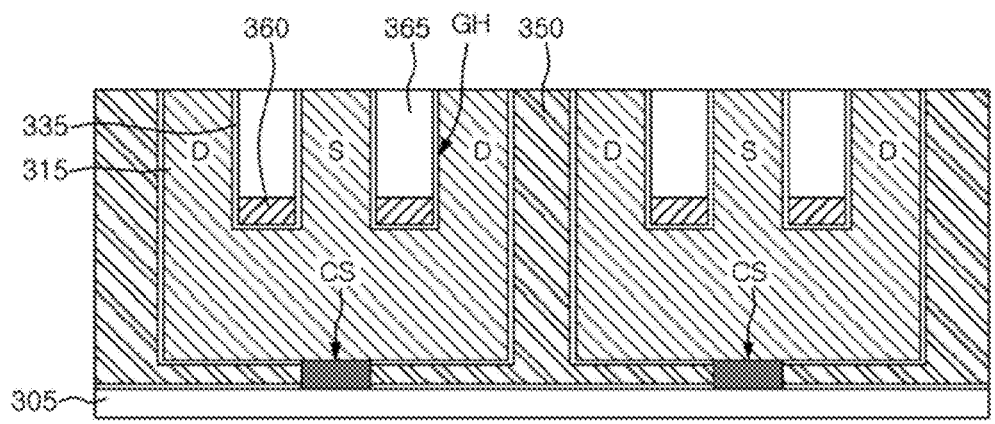
FIGS. 5 to 7 are cross-sectional views illustrating a method of fabricating a semiconductor integrated circuit including a horizontal channel switching device (transistor) according to an embodiment of the inventive concept.

Referring to FIG. 5, an active region 315 supported by a common source region CS is formed on a semiconductor substrate 305. The common source region CS and the active region 315 are formed of different semiconductor layers. The common source region CS may have a node type or a line type. To define the node or line type common source region CS, the common source region CS and the active region 315 may be formed of semiconductor materials having different etch rates, i.e., with great etch selectivity therebetween. In an embodiment, the common source region CS may be formed of a silicon germanium (SiGe) material, and the active region 315 may be formed of a silicon (Si) material.

A gate groove GH is formed in a predetermined region of the active region 315 to define a source region S and a drain region D. Active regions 315 on both sides of the gate groove GH may be the source region S and the drain region D. In an embodiment, the source region S and the drain region D are formed so that one source region S is located between a pair of drain regions D. The source region S may be defined in a location corresponding to the common source region CS.

An oxidation process is performed on the semiconductor substrate, in which the gate groove GH is formed, to form a gate insulating layer 335 on surfaces of the gate groove GH and the active region 315. A gap-fill layer 350 is buried in a space between the active regions 315. Next, a gate electrode 360 is formed in a lower portion of the gate groove GH. The forming of the gate electrode 360 may include forming a conductive layer within the gate groove GH, and over-etching the conductive layer to be left in the lower portion of the gate groove GH. After the gate electrode 360 is formed, a sealing insulating layer 365 is filled within the gate groove GH.

Figure 6:
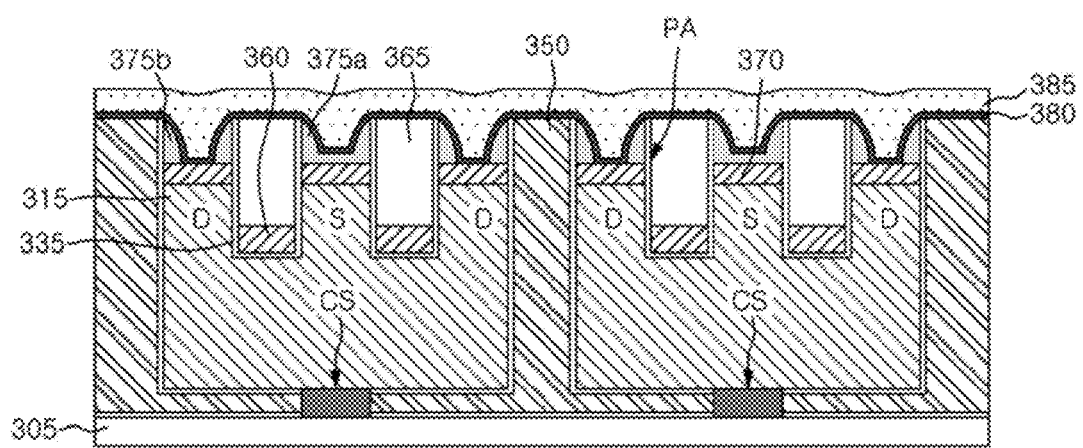

As illustrated in FIG. 6, the source and drain regions S and D at both sides of the gate groove GH are etched to a certain depth to define a phase-change region PA. Impurities may be implanted into the source and drain regions S and D exposed by the phase-change region PA to define a source and a drain of the switching device.

Next, a lower electrode 370 is formed on the source and drain regions S and D within the phase-change region PA through a general method. The forming of the lower electrode 370 may include forming a conductive layer to be buried in the phase-change region PA and recessing the conductive layer to be left in a lower portion of the phase-change region PA.

An insulating layer that acts as a spacer is deposited on the semiconductor substrate in which the lower electrode 370 is formed, and then etched to form a first spacer 375a and a second spacer 375b. The first spacer 375a may be located in the source region S, and formed to shield the lower electrode 370 on the source region S. The second spacer 375b may be located in the drain region D and formed to expose the lower electrode 370 on the drain region D.

A crystalline first phase-change layer 380 is formed along surfaces of the lower electrode 370, the spacers 375a and 375b, and the gap-fill layer 350. Subsequently, a buried second phase-change layer 385 is deposited on the crystalline first phase-change layer 380. The second phase-change layer 385 may be formed with a thickness sufficient to fill the phase-change region, and deposited under conditions where amorphous characteristics are provided to the second phase-change layer to obtain effective gap-fill. Since the crystalline characteristics are provide to the second phase-change layer 385 by the first phase-change layer 380 below the second phase-change layer 385, the second phase-change layer 385 has a certain degree of crystallinity even when the second phase-change layer 385 is deposited under amorphous deposition conditions. Therefore, the second phase-change layer itself may serve as a phase-change layer without performing a separate heat-treatment process. Further, an additional heat-treatment process may be performed to obtain complete gap-filling.

Figure 7:
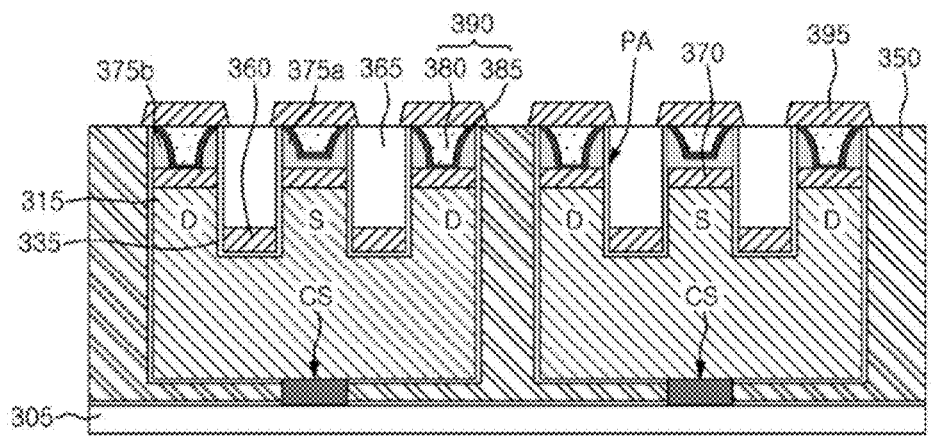

Referring to FIG. 7, the second and first phase-change layers 385 and 380 are planarized to be left in the phase-change region PA, and thus a resistive layer 390 is formed. Next, an upper electrode 395 may be formed on the resistive layer 390 through a general method.

Figure 8:
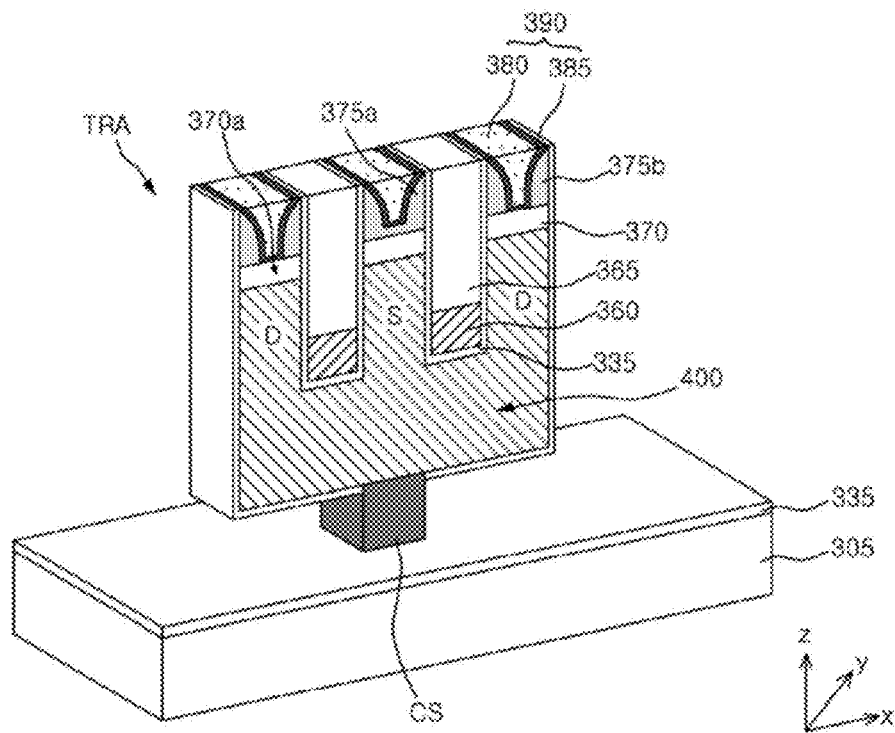
FIG. 8 is a perspective view illustrating a semiconductor integrated circuit including a horizontal channel transistor according to an embodiment of the inventive concept.

FIG. 8 is a perspective view illustrating a semiconductor integrated circuit including a horizontal channel transistor according to an embodiment of the inventive concept.

Referring to FIG. 8, a transistor TRA having a horizontal channel is formed on a semiconductor substrate 305 to be supported by a common source node CS.

The transistor TRA may include a horizontal channel region 400, and source and drain regions S and D branching from the horizontal channel region 400 to a Z-direction.

The transistor TRA is formed so that the source region S is located to correspond to the common source region CS, and the drain regions D are provided at both sides of the source region S. Therefore, the transistor TRA has a structure in which a pair of drain regions D share one source region S. The source and drain regions S and D are spaced at intervals from each other.

A gate electrode 360 may be located in a space between the source and drain regions S and D, and a gate insulating layer 335 may be located between the source region S and the gate electrode 360 and between the drain region D and the gate electrode 360.

Lower electrodes 370 are located on the source and drain regions S and D, and spacers 375a and 375b are formed on edges of a space defined by a phase-change region PA.

A first spacer 375a on the source region S may be formed to shield the lower electrode 370, and thus a resistive layer 390 and the lower electrode 370 may be electrically isolated from each other. A second spacer 375b on the drain region D may be formed to expose the lower electrode 370.

The resistive layer 390 is located on the lower electrode 370 in the phase-change region PA. The resistive layer 390 may include a crystalline first phase-change layer 380 and a second phase-change layer 385 formed using the first phase-change layer 380 as a seed.

Although not shown in FIG. 8, an upper electrode may be formed on the resistive layer 390.

In a semiconductor integrated circuit according to the embodiments, the resistive layer may include the first phase-change layer having a crystalline structure, and the second phase-change layer formed on the first phase-change layer and formed to have a certain degree of crystallinity given from the first phase-change layer. Since the second phase-change layer to be gap-filled is grown based on the crystallinity of the first phase-change layer, located below the second phase-change layer, and deposited under conditions where the second phase-change layer has amorphous characteristics to obtain good gap-fill properties, the second phase-change layer may be easily buried in the phase-change region, and the heat-treatment process may be omitted. In some cases, a low-temperature heat treatment process may be performed, and thus deterioration of the device may be reduced.

The above embodiments of the present invention are illustrative and do not limit the scope of the present invention. Various alternatives and equivalents are possible and the invention is not limited to any specific type of semiconductor device. Other additions, subtractions, or modifications may be obvious in view of the present disclosure and are intended to fall within the scope of the appended claims.

What is claimed is:

1. A method of fabricating a semiconductor integrated circuit, the method comprising:
   forming a lower electrode in a semiconductor substrate;
   forming an interlayer insulating layer;
   etching the interlayer insulating layer to form a hole for exposing the lower electrode;
   forming an insulating spacer on a sidewall of the hole;
   forming a first phase-change layer having a crystalline state along surfaces of the spacer and an exposed lower electrode;
   forming a second phase-change layer on the first phase-change layer based on crystallinity of the first phase-change layer to be filled in the hole under an amorphous deposition conditions;
   forming a resistive layer by planarizing the second phase-change layer and the first phase-change layer to be left in the hole; and
   forming an upper electrode on the resistive layer,
   wherein a bottom surface and a sidewall of the second phase-change layer are contacted with the first phase-change layer with maintaining the crystalline state and an upper surface of the second phase-change layer is contacted with the upper electrode.

2. The method of claim 1, wherein the first phase-change layer is formed at a crystallization temperature of the first phase-change layer through a chemical vapor deposition (CVD) method or an atomic layer deposition (ALD) method.

3. The method of claim 1, wherein the second phase-change layer is formed to have a partially crystalline state by depositing the second phase-change layer along crystals of the first phase-change layer under the amorphous deposition conditions.

4. The method of claim 3, wherein the second phase-change layer is formed in a temperature range of 200 to 400° C. through an ALD method.

5. The method of claim 1, further comprising, after the forming of the second phase-change layer or the foiling of the resistive layer:
heat-treating the second phase-change layer.

* * * * *